United States Patent [19]

Alexander

[11] Patent Number: 5,097,223

[45] Date of Patent: Mar. 17, 1992

[54] CURRENT FEEDBACK AUDIO POWER AMPLIFIER

[75] Inventor: Mark A. J. Alexander, Sunnyvale, Calif.

[73] Assignee: Analog Devices, Inc., Norwood, Mass.

[21] Appl. No.: 526,986

[22] Filed: May 22, 1990

[51] Int. Cl.$^5$ .............................................. H03F 3/68
[52] U.S. Cl. ................................. 330/126; 330/255; 330/257; 330/260; 330/295
[58] Field of Search ............... 330/126, 255, 257, 260, 330/295

[56] References Cited

U.S. PATENT DOCUMENTS 3,846,710 11/1974 Chapman ..................... 330/126 X
4,555,672 11/1985 Segan .............................. 330/255

FOREIGN PATENT DOCUMENTS 37717 4/1981 Japan ................................. 330/126

Primary Examiner—James B. Mullins
Attorney, Agent, or Firm—Koppel & Jacobs

[57] ABSTRACT

An audio power amplifier achieves a closed-loop bandwidth which is relatively independent of gain, and a very high slew rate capability, with a current feedback operational amplifier design. A separate operational amplifier which is connected as an integrator and operates at sub-audio frequencies compensates for the output terminal bias current of the first operational amplifier, thus mitigating the effects of current mirror mismatch in the current feedback circuit and allowing the overall output offset voltage to be significantly reduced.

23 Claims, 2 Drawing Sheets

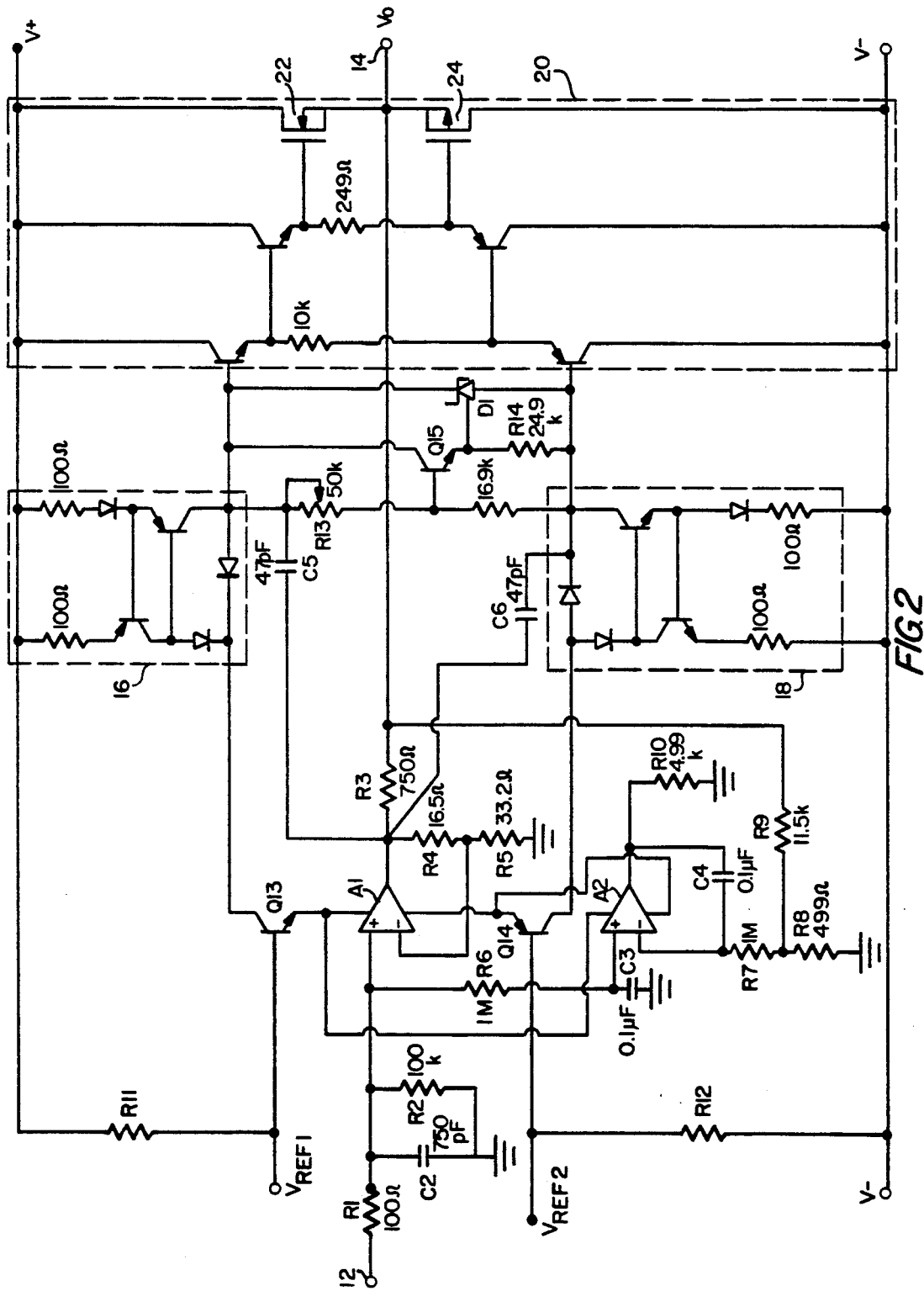

CURRENT FEEDBACK AUDIO POWER AMPLIFIER

BACKGROUND OF THE INVENTION

1. Field of the Invention

This invention relates to power amplifiers for electric signals in the audio frequency range.

2. Description of the Related Art

Power amplification is an important requirement in many different areas of the audio industry, such as high quality equipment used for monitoring during mastering and mixdown, large and powerful sound reinforcement systems used for live performances, and consumer level audio reproduction equipment. Improvements in recording and reproduction technology have placed increasingly heavier demands upon audio amplifiers to deliver more power, provide greater dynamic headroom and generate less distortion. New high quality loudspeaker systems can be particularly sensitive to amplifier deficiencies.

Most present power amplifier designs use the voltage feedback approach made popular by the availability of modern integrated circuit operational amplifiers. These designs are relatively inexpensive and can provide adequate amplification levels. However, they do have some disadvantages. The bandwidth of a voltage feedback operational amplifier is generally inversely proportional to its closed-loop gain; this can lead to a serious degradation in performance at the higher gain levels. Also, the slew-rate of voltage feedback amplifiers is usually restricted because the transconductance stage has a finite maximum output current available to charge the compensation capacitor. This can lead to poor dynamic intermodulation distortion performance. Small compensation capacitor values can be used to increase the slew-rate. This, however, requires a degeneration of the input stage to reduce the transconductance in the interest of amplifier stability, which in turn reduces the amplifier's open-loop gain. The reduction in loop gain available in the audio band in turn leads to an increase in the closed-loop amplifier distortion, most of which originates with the highly non-linear output stage. An audio amplifier designer is thus faced with a dilemma, because a trade-off must be made between stability, open-loop gain and slew-rate without compromising AC performance and transient response.

One type of amplifier that does not exhibit the bandwidth variation of voltage feedback amplifiers is the current feedback operational amplifier. While this amplifier displays some variation in bandwidth as the gain is increased from unity to moderate values, the variation is much less significant than with voltage feedback amplifiers. Current feedback amplifiers do not begin to exhibit the bandwidth variation of voltage-feedback amplifiers until the closed-loop gain is made quite large. Also, current feedback operational amplifiers almost generally have higher slew rates than voltage-feedback amplifiers for a given quiescent supply current, and exhibit relatively low transient distortion.

The basic architecture of a conventional current feedback amplifier is shown in FIG. 1. An input buffer 2, implemented with transistors Q1–Q4, forms a voltage follower which forces the inverting input to the potential of the non-inverting input. The collectors of transistors Q3 and Q4 supply reference currents to respective current mirrors 4 and 6, whose outputs are applied to a gain node 8. Any imbalances in the collector currents of Q3 and Q4 are reflected by the current mirrors and summed at the gain node, charging a capacitor C1. This voltage developed across C1 in turn is applied to an output terminal 10 through an output current gain stage consisting of transistors Q9–Q12.

Negative feedback is provided from the output terminal 10 to the inverting input of input buffer 2 through a feedback resistor $R_{FB}$. This feedback circuit tends to counteract current imbalances in the current mirrors, thus causing the output voltage at terminal 10 to track the input signal at the non-inverting input to input buffer 2. Resistors can be added from the inverting amplifier input to ground to increase the gain, in the same fashion as for a conventional operational amplifier.

Although the current feedback amplifier achieves a high large-signal bandwidth and slew-rate as discussed above, it also has certain disadvantages. In particular, the low frequency or DC characteristics are not ideal. With both current feedback and voltage feedback operational amplifiers, there is an input voltage offset associated with mismatches between the transistors in the input stage, and this results in a finite output offset voltage. The offset voltage can be made acceptably low by conventional techniques such as resistor trimming to obtain precise values. However, there is another component of the output voltage offset which is present only with current feedback amplifiers, and not with voltage feedback designs. This component of offset results from a bias current which originates primarily from imbalances between the two current mirrors, and is usually larger than the offset voltage associated with the input buffer. Current feedback amplifiers are thus not normally used at low frequencies, significantly below 1 MHz, and in particular their advantages have not previously been applied to audio frequency power amplifiers.

SUMMARY OF THE INVENTION

The present invention brings the benefits of the current feedback amplifier to the realm of audio frequency power amplifiers, while at the same time mitigating the degradation in low frequency performance which normally accompanies current feedback designs.

To accomplish this result, a voltage feedback operational amplifier is connected as the input buffer within a specially designed current feedback audio frequency power amplifier. The operational amplifier, used as the input buffer, is connected in a voltage gain feedback circuit, which amplifies input audio frequency signals and applies them to an output terminal. A capacitance circuit connected to the gain node is charged by the current mirrors which transiently adjust the voltage at this node, and hence at the output terminal, in response to changes in the audio input signal.

A separate gain path is provided for sub-audio and DC components of the input signal by a separate operational amplifier circuit which has a sub-audio crossover frequency. This sub-audio operational amplifier has a local integrating feedback loop, and is connected in a voltage feedback loop with the output terminal. Its current supply ports are connected to provide offset cancellation currents to the current supply ports of the first operational amplifier, thereby tending to compensate for current imbalances between the current mirrors that are connected to the gain node, and to reduce the output offset voltage of the audio power amplifier. The audio and sub-audio circuits have approximately equal voltage gains within their respective frequency ranges. Additional design features include connecting the capacitance circuit from the gain node to the output of the first operational amplifier, instead of to the ground or common point, and also connecting the current feedback path from the output terminal back to the first operational amplifier's output.

Further features and advantages of the invention will be apparent to those skilled in the art from the following detailed description of a preferred embodiment, taken together with the accompanying drawings, in which:

DESCRIPTION OF THE DRAWINGS

FIG. 2 is a circuit diagram showing a preferred embodiment for the audio power amplifier of the present invention.

DETAILED DESCRIPTION OF A PREFERRED EMBODIMENT

Figure 1:
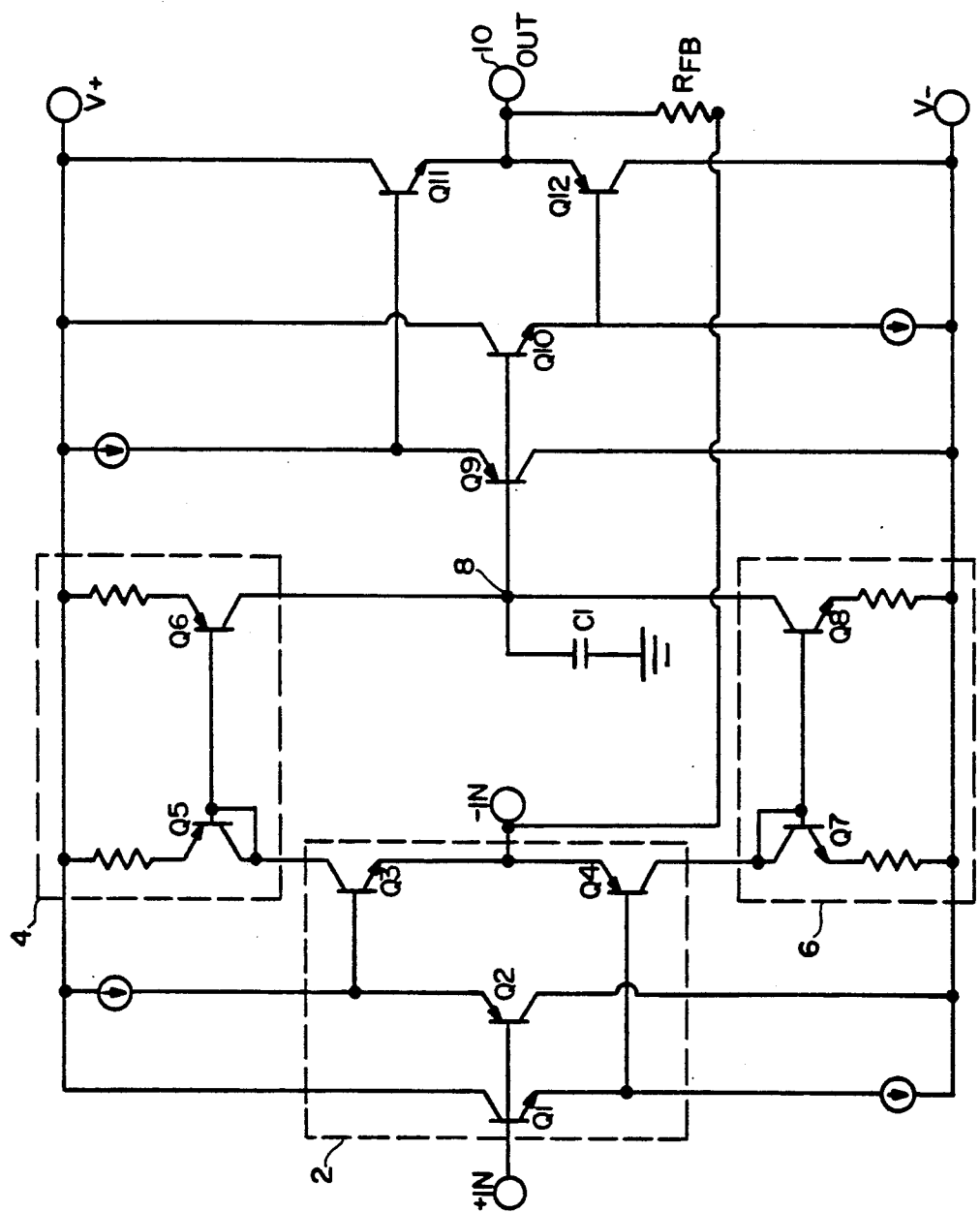
FIG. 1 is a circuit diagram showing a conventional current feedback operational amplifier.

A preferred embodiment of the present invention is shown in somewhat simplified form in FIG. 2. It employs a pair of operational amplifiers A1 and A2; A1 is a buffer amplifier used for audio gain, while A2 is used for sub-audio gain. A1 should have at least a moderately high slew rate, on the order of at least 20 volts/microsecond, low voltage noise and distortion, a supply current that is not excessively high (preferably less than 5 milliamps) and a good square wave response with little overshoot. The OP-42 and SSM-2131 products, both produced by Precision Monolithics, Inc., are suitable for this purpose. The OP-42 has a 10 MHz gain-bandwidth product with a slew rate of 50 volts/microsecond. The circuit for A2 should have a sub-audio crossover frequency, generally less than 10 Hz and preferably about 1.6 Hz, to isolate the sub-audio path from the main audio amplification circuitry. The OP-97 and OP-90 operational amplifiers produced by Precision Monolithics, Inc. are suitable.

An input audio signal at input terminal 12 is directed through an input filter consisting of R1 and C2 to the non-inverting input of audio amplifier A1. The input filter has a cut-off frequency of approximately 2 MHz to eliminate potential RF interference, and also to prevent the possibility of the amplifier oscillating on power-up when the input is left floating. A larger resistor R2 is connected to ground at the non-inverting input of A1 to provide a DC bias current path to ground in case the input is inadvertently left open.

The output of A1 is connected in a voltage gain feedback circuit back to its inverting input. The A1 output is connected to the output terminal 14 of the overall audio power amplifier via a feedback resistor R3. Two other resistors R4 and R5 are connected in series between the A1 output and ground, with a connection to A1's non-inverting input tapped from the R4/R5 interconnection.

The voltage gain for the overall amplifier circuit, taken at output terminal 14, is $(1+R4/R5)[1+R3/(R4+R5)]$. The indicated values for R3, R4 and R5 in FIG. 2 yield an audio gain of approximately 24.

The signal applied at the non-inverting input of A2 is restricted to sub-audio components of the input signal at terminal 12 by means of a series RC circuit consisting of resistor R6 between the non-inverting inputs of A1 and A2, and capacitor C3 between A2's non-inverting input and ground. C3 has a very high impedance for DC and near-DC components of the input signal, so that these components appear in close to their original form at the non-inverting input of A2. The impedance of C3 is much lower at audio frequencies, causing most of the signal at these frequencies to appear across R6 and thus be isolated from A2. be isolated from A2.

A voltage gain feedback loop is connected across A2, and is designed to produce a sub-audio frequency gain for A2 that approximately equals the audio frequency gain of A1. This gain is predominant only at DC and low frequencies because A2 is connected as an integrator. The feedback circuit includes a capacitor C4 between the output and inverting input of A2 (the integrating capacitor), series resistors R7 and R8 between the inverting A2 input and ground, and a resistor R9 between output terminal 14 and the intersection of R7 and R8. A2 should have a low offset current in addition to a low offset voltage, because large (1M ohm) resistors are connected to its input pins to obtain the low integrator crossover frequency. Too large an offset current would cause additional output offsets due to the differential voltage drop across these resistors.

The voltage gain between the sub-audio input to A2 and the output signal at terminal 14 is $(1+R9/R8)$; with the resistor values shown in FIG. 2, this sub-audio gain also equals approximately 24. A relatively high resistance R10 between the output of A2 and ground causes A2 to operate as an operational transconductance amplifier, and thereby provide output currents from its current supply terminals in response to variations in its input signals.

A pair of nominally matched Wilson current mirrors 16 and 18 are used to provide charging current to the gain node of the amplifier. Mirror 16 supplies current while mirror 18 draws current, as in a conventional current feedback amplifier. The reference current for mirror 16 is supplied through a voltage regulator transistor Q13 by the positive current supply port of A1, while the reference current for mirror 18 is drawn from the negative current supply port of A1 through a second voltage regulating transistor Q14. Base voltage reference levels are provided for bipolar transistor Q13 and Q14, such as by connecting pairs of zener diodes from their bases to ground, while bias resistors R11 and R12 connect the bases of Q13 and Q14 respectively to positive and negative voltage supply buses V+ and V−.

The mirrored current outputs from mirrors 16 and 18 are connected respectively to signal storage elements in the form of capacitors C5 and C6. Transient voltages are developed across these capacitors in response to changes in the input signal at input terminal 12, and these voltages appear at output terminal 14 after buffering by a standard current gain output stage shown enclosed within dashed line 20. The other sides of C5 and C6 are connected directly to the output of A1. Connecting them in this manner, rather than to ground or the power supply buses as in a conventional current feedback operational amplifier, has been found to compensate for high frequency rolloff in the output stage.

The output stage includes an n-channel power metal-oxide-semiconductor field effect transistor (MOSFET) 22 and a p-channel MOSFET 24, with output terminal 14 taken between the two. A current limiting circuit can be provided if desired to limit the current in the output stage to a safe value. A conventional bias generator circuit, consisting of a programmable zener diode D1 driven by a transistor Q15, which in turn is biased by variable resistor R13 in series with resistor R14, generates a bias voltage between the inputs to the output stage sufficient to keep the n-channel and p-channel MOSFETs 22 and 24 turned on.

The output terminal 14 is connected in a current feedback circuit to the output of A1 via R3. This current feedback path balances the output current from A1 during changes in its input audio signal, and thus provides the means for the voltage at output terminal 14 to follow the input signal to A1 in a stable and amplified manner. Output terminal 14 is also connected to the voltage feedback circuit for sub-audio amplifier A2, as described above.

One important aspect of A2 is that its current supply ports are connected to the current mirror reference lines in a manner directly parallel with the current supply ports of A1 through transistors Q13 and Q14. This produces a sub-audio frequency compensation current that materially reduces the output offset voltage from the audio power amplifier, as discussed below.

The operation of the circuit will now be described. Assume that the input audio voltage signal to the non-inverting input of A1 increases. The voltage at the output of A1 will also go up, in normal operational amplifier fashion. This increases the current through R5, with a corresponding increase in the current through R4. The increased current is supplied through A1's positive current supply port from current mirror 16 via Q13. The current through Q13 is reflected in the current mirror and used to charge capacitors C5 and C6 and thus increase the output voltage at output terminal 14 via the output current gain stage 20. The increase in voltage at output terminal 14 produces a feedback current through R3 to the output of A1 which reduces the current imbalance between R3 and R4 and tends to counteract the initial increase in current supply required from the current mirror 16 via Q13.

It should be noted at this point that a smaller current is flowing to the lower current mirror 18, and a current differential thus exists between the two mirrors. As the circuit continues to adjust to the increased input signal, the output voltage at output terminal 14 increases until it reaches the desired value, at which point the current through R3 equals the current through R4 and R5. Under these equilibrium conditions, the current supply through Q13 has diminished almost to that of Q14, and the current differential between the two mirrors has also been reduced to almost zero. A small but finite current differential is still needed to sustain the new higher output voltage that must be internally generated at the gain node.

As A1 is responding to the increased signal at its non-inverting input, A2 receives the low frequency sub-audio components of that signal. Since the output of A2 is connected to ground through resistor R10, it behaves as an operational transconductance amplifier with the output current taken from its current supply terminals. This compensating sub-audio frequency current is fed into the two common-base voltage regulator transistors Q13, Q14, where it is summed with the supply current for A1. The output supply current of A2 is therefore forced to cancel the Q13 and Q14 emitter current imbalances, which would result in a non-zero bias current at the output of A1, almost exactly. This occurs because the DC gain of the A2 integrator loop, coupled with the additional gain produced by the transimpedance stage, is very high. Consequently, the integrating control loop of A2 overrides and dominates the current feedback loop of the overall amplifier at sub-audio frequencies in the vicinity of DC.

A similar response occurs for a decrease in the input signal to A1. In this case current flows out of A1's negative current supply port to be reflected by mirror 18 and used to charge C5 and C6. While the transient current flows are in the opposite direction, the same type of compensation takes place.

With only A1 in the circuit, the output offset voltage of the audio amplifier would be equal to the input offset voltage for A1 multiplied by the gain of the overall amplifier (nominally=24), plus the bias current at the output of A1 multiplied by R3. With the addition of A2, which substantially cancels the bias current appearing at the output terminal of A1 at near-DC sub-audio levels, the audio amplifier's output offset voltage is reduced to the input offset voltage of A2 multiplied by the gain defined by resistors R8 and R9. This value of output offset voltage can be made arbitrarily small by the use of a low offset amplifier for A2, such as the specific amplifier models mentioned above. The sub-audio circuit associated with A2 thus effectively corrects for current mirror mismatch, and makes possible the elimination of offset trimming.

A novel audio power amplifier design which achieves the advantages of current feedback but mitigates its principal disadvantages, and makes the current feedback concept applicable to the audio frequency range, has thus been shown and described. As numerous variations and alternate embodiments will occur to those skilled in the art, it is intended that the invention be limited only in terms of the appended claims.

I claim:

1. A power amplifier for electrical signal in the audio frequency range, comprising:
   an input stage including an audio frequency operational buffer amplifier having a pair of current supply ports, and an output connected in a local voltage gain feedback circuit, one input of said operational amplifier being connected to receive an electrical input signal in the audio frequency range and its other input connected in said voltage gain feedback circuit,
   an output terminal,
   a pair of current mirrors connected to supply transient currents to respective operational amplifier current supply ports in response to changes in said input electrical signal, and to provide mirrored values of said transient currents,
   a charge storage means connected to receive said mirrored currents and to adjust the voltage at said output terminal in response thereto,
   an output current gain stage connected in circuit between said signal storage means and said output terminal, and
   a current feedback circuit between said output terminal and said operational amplifier to assist voltage tracking between said output terminal and said electrical input signal.

2. A power amplifier for electrical signals in the audio frequency range, comprising:
   an input stage including an audio frequency operational buffer amplifier having a pair of current supply ports, and connected in a voltage gain feedback circuit, one input of said operational amplifier being connected to receive an electrical input signal in the audio frequency range and its other input connected in said voltage gain feedback circuit, an output terminal, a pair of current mirrors connected to supply transient currents to respective operational amplifier current supply ports in response to changes in said input electrical signal, and to provide mirrored values of said transient currents, a change storage means connected to receive said mirrored currents and to adjust the voltage at said output terminal in response thereto, an output current gain stage connected in circuit between said signal storage means and said output terminal, a current feedback circuit between said output terminal and said operational amplifier to assist voltage tracking between said output terminal and said electrical input signal, and a sub-audio frequency operational amplifier connected in a voltage gain feedback circuit with a sub-audio crossover frequency, one input of said sub-audio frequency operational amplifier being connected to receive sub-audio frequency components of said electrical input signal, said sub-audio frequency operational amplifier connected to provide a sub-audio frequency amplification path to said output terminal.

3. The audio power amplifier of claim 2, said audio frequency and sub-audio frequency operational amplifiers being connected to have generally equal values of gain within their respective frequency ranges.

4. The audio power amplifier of claim 2, the voltage gain feedback circuit for said sub-audio frequency operational amplifier feeding a local integrating feedback circuit connected around said sub-audio frequency operational amplifier.

5. The audio power amplifier of claim 2, wherein said output terminal is connected in a voltage gain feedback circuit for said sub-audio frequency operational amplifier.

6. The audio power amplifier of claim 2, said sub-audio frequency operational amplifier including a pair of current supply ports which are connected to the current supply ports of said audio frequency operational amplifier to supply a correction current to said audio frequency operational amplifier, thus substantially canceling the error current resulting from mismatches between said current mirrors, and thereby reducing the output offset voltage from said audio power amplifier.

7. The audio power amplifier of claim 6, wherein said sub-audio frequency operational amplifier is connected as an operational transconductance amplifier with its output connected to ground through a resistor, and thereby provides output current from its current supply ports in response to variations in its input signal.

8. A power amplifier for electrical signals in the audio frequency range, comprising:

an input stage including an audio frequency operational buffer amplifier having a pair of current supply ports, and connected in a voltage gain feedback circuit, one input of said operational amplifier being connected to receive an electrical input signal in the audio frequency range and its other input connected in said voltage gain feedback circuit, an output terminal, a pair of current mirrors connected to supply transient currents to respective operational amplifier current supply ports in response to changes in said input electrical signal, and to provide mirrored values of said transient currents, a charge storage means comprising a capacitance circuit connected between said current mirrors and the output of said operational amplifier to receive said mirrored currents and to adjust the voltage at said output terminal in response thereto, an output current gain stage connected in circuit between said signal storage means and said output terminal, and a current feedback circuit between said output terminal and said operational amplifier to assist voltage tracking between said output terminal and said electrical input signal.

9. A power amplifier for electrical signals in the audio frequency range, comprising:

an input stage including an audio frequency operational buffer amplifier having a pair of current supply ports, and connected in a voltage gain feedback circuit, one input of said operational amplifier being connected to receive an electrical input signal in the audio frequency range and its other input connected in said voltage gain feedback circuit, an output terminal, a pair of current mirrors connected to supply transient currents to respective operational amplifier current supply ports in response to changes in said input electrical signal, and to provide mirrored values of said transient currents, a charge storage means connected to receive said mirrored currents and to adjust the voltage at said output terminal in response thereto, an output current gain stage connected in circuit between said signal storage means and said output terminal, and a current feedback circuit between said output terminal and said operational amplifier to assist voltage tracking between said output terminal and said electrical input signal, said current feedback circuit being connected between said output terminal and the output of said operational amplifier.

10. A power amplifier for electrical signals in the audio frequency range, comprising:

an output terminal, a first operational amplifier connected to receive an electrical input signal in the audio frequency range and to provide an amplified version of said input signal to said output terminal, said first operational amplifier being connected in a current feedback circuit with said output terminal, and a second operational amplifier having a sub-audio crossover frequency and connected to provide an amplified version of sub-audio components of said input signal to said output terminal, said second amplifier dominating the first amplifier at said output terminal for components of the input signal having a frequency below said crossover frequency, said second sub-audio operational amplifier operating as an integrator and being connected in circuit with said output terminal in a voltage feedback circuit.

11. The audio power amplifier of claim 10, wherein said first and second operational amplifiers have respective pairs of current supply ports, said current feedback circuit includes a pair of nominally matched current mirrors connected to supply transient current to respective current supply ports of the first operational amplifier, and the current supply ports of said second operational amplifier are connected to respective current supply ports of the first operational amplifier to at least partially compensate for current mismatches between said current mirrors, thereby reducing the output terminal bias current for said first operational amplifier and thus reducing the output offset voltage of the audio power amplifier.

12. The audio power amplifier of claim 11, wherein said second operational amplifier is connected as an operational transconductance amplifier with its output connected to ground through a resistor, and thereby provides output current from its current supply terminals.

13. The audio power amplifier of claim 10, wherein said current feedback circuit is connected between said output terminal and the output of said first operational amplifier.

14. A power amplifier for electrical signals in the audio frequency range, comprising:
   first and second operational amplifiers having respective inverting and non-inverting inputs, current supply ports, and outputs,
   means for applying an input signal to be amplified to the non-inverting input of the first operational amplifier,
   input circuitry for segregating the sub-audio components of said input signal and applying said sub-audio components to said second operational amplifier, said second operational amplifier being connected in an integrating local feedback circuit to amplify substantially only said sub-audio frequency components of said input signal,
   respective voltage feedback circuits providing voltage gains for said first and second operational amplifiers,
   a pair of nominally matched current mirrors having reference current ports connected to respective current supply ports of said first operational amplifier, and mirrored current ports,
   an output terminal,
   a capacitive circuit connected in circuit with said mirrored current ports and said first operational amplifier output to adjust the output terminal voltage in response to changes in said input signal,
   an output current gain stage connected between said capacitive circuit and said output terminal,
   a current feedback circuit between said output terminal and said first operational amplifier,
   a voltage feedback circuit between said output terminal and the local integrating feedback circuit for said second operational amplifier, said second operational amplifier and its associated feedback circuits dominating the output signal at said output terminal over a sub-audio frequency range, and
   means connecting the current supply ports of said second operational amplifier to provide offset cancellation currents to the current supply ports of said first operational amplifier, thereby tending to compensate for current mismatches between said current mirrors and to reduce the output offset voltage of the audio power amplifier.

15. The audio power amplifier of claim 14, wherein said current and voltage feedback circuits provide substantially equal values of voltage gain for said first and second operational amplifier.

16. The audio power amplifier of claim 14, said second operational amplifier circuitry having a sub-audio crossover frequency.

17. The audio power amplifier of claim 14, the non-inverting input of the second operational amplifier being connected to the non-inverting input of the first operational amplifier through an RC circuit that substantially isolates the second operational amplifier from audio frequency inputs.

18. The audio power amplifier of claim 14, wherein said capacitive circuit is connected on one side to said mirrored current ports and said output current gain stage, and on the other side to the output of the first operational amplifier.

19. The audio power amplifier of claim 14, the voltage and current feedback circuits for said first operational amplifier comprising respective resistor circuits.

20. The audio power amplifier of claim 14, said second operational amplifier being connected as an RC integrating gain circuit with voltage feedback from said output terminal.

21. The audio power amplifier of claim 20, said RC integrating circuit comprising a capacitance connected between the output and inverting input of said second operational amplifier and a resistance connected between said inverting input and said voltage feedback circuit from the output terminal, said voltage feedback circuit comprising a plurality of sub-audio output gain setting resistances connected to the resistance in said RC integrating circuit.

22. The audio power amplifier of claim 21, wherein the output of said second operational amplifier is connected through a resistance to ground.

23. The audio power amplifier of claim 14, wherein said current feedback circuit is connected between said output terminal and the output of said first operational amplifier.

* * * * *